United States Patent
Yu et al.

(10) Patent No.: US 11,234,341 B2
(45) Date of Patent: Jan. 25, 2022

(54) SERVER RACK AND DUMMY CHASSIS THEREOF

(71) Applicant: CHENBRO MICOM CO.,LTD., New Taipei (TW)

(72) Inventors: Cheng-Han Yu, New Taipei (TW); Ming-Huei Hsiao, New Taipei (TW); Wei-Cheng Ma, New Taipei (TW)

(73) Assignee: CHENBRO MICOM CO., LTD., New Taipei (TW)

( * ) Notice: Subject to any disclaimer, the term of this patent is extended or adjusted under 35 U.S.C. 154(b) by 27 days.

(21) Appl. No.: 16/726,921

(22) Filed: Dec. 25, 2019

(65) Prior Publication Data
US 2020/0214166 A1 Jul. 2, 2020

(30) Foreign Application Priority Data
Dec. 28, 2018 (TW) .................................. 107217866

(51) Int. Cl.
*H05K 7/18* (2006.01)
(52) U.S. Cl.
CPC .................................... *H05K 7/183* (2013.01)
(58) Field of Classification Search
CPC .............................. H05K 7/183; H05K 7/1488
See application file for complete search history.

(56) References Cited

U.S. PATENT DOCUMENTS

| | | | |
|---|---|---|---|
| 7,835,148 B2* | 11/2010 | Tu ........................... | G06F 1/187 361/679.39 |
| 9,572,271 B2* | 2/2017 | Mills ...................... | H05K 9/006 |
| 2008/0135705 A1* | 6/2008 | Chuang ................ | H05K 7/1489 248/243 |
| 2014/0362515 A1* | 12/2014 | Pronozuk ............. | H05K 7/1487 361/679.31 |
| 2018/0352675 A1* | 12/2018 | Corbo .................... | H05K 7/183 |

FOREIGN PATENT DOCUMENTS

| | | |
|---|---|---|
| CN | 102692167 A | 9/2012 |
| TW | 201306693 A1 | 2/2013 |
| TW | 201442590 A | 11/2014 |

* cited by examiner

*Primary Examiner* — Rockshana D Chowdhury
(74) *Attorney, Agent, or Firm* — CKC & Partners Co., LLC

(57) ABSTRACT

A dummy chassis includes a first frame bar, a second frame bar and a connection member. The first frame bar has a first long side and a first engaging portion. The second frame bar has a second long side and a second engaging portion. The connection member has two end portions which are located oppositely. The first end portion has a third engaging portion. The second end portion has a fourth engaging portion. A width of the connection member is less than a length of the first frame bar and a length of the second frame bar.

18 Claims, 11 Drawing Sheets

SERVER RACK AND DUMMY CHASSIS THEREOF

RELATED APPLICATIONS

This application claims priority to Taiwan Application Serial Number 107217866, filed Dec. 28, 2018, which is herein incorporated by reference.

BACKGROUND

Field of Disclosure

The disclosure relates to a dummy chassis. More particularly, the disclosure relates to a server rack and its dummy chassis.

Description of Related Art

A current rackmount chassis is allowed to receive a plurality of server units installed with a multi-layered arrangement. Each server unit can be loaded with a plurality of work units (e.g., hard disk or flash memory) for executing big data of computing projects in the cloud. Therefore, an operator can pull any level of server unit out of the rackmount chassis for repairing or replacement of these work units. In addition, each of the server units located on one of the layers is connected to one of the power sockets which is located at the same layer in the rackmount chassis to obtain electricity power through the rackmount chassis.

However, when the configuration space of a certain layer in the rackmount chassis without receiving the server unit exposes one of the power sockets, a maintenance personnel may accidentally touch the power socket of the certain layer to be injured. Also, the configuration space of a certain layer in the rackmount chassis without receiving the server unit may cause the intrusion of dust, foreign objects or interfere with the preset airflow path in the rackmount chassis.

Therefore, how to develop a solution to improve the foregoing deficiencies and inconvenience is an important issue that relevant persons engaged in the industry are currently unable to delay.

SUMMARY

In one embodiment of the disclosure, a dummy chassis is provided, and the dummy chassis includes a first frame bar, a second frame bar and a connection member. The first frame bar has a first long side and a first engaging portion. The second frame bar has a second long side and a second engaging portion. The connection member has a first end portion and a second end portion which are located oppositely, the first end portion having a third engaging portion, the second end portion having a fourth engaging portion, and a width of the connection member is less than a length of the first frame bar and a length of the second frame bar. When the first frame bar, the second frame bar and the connection member are combined into a first appearance, the first end portion of the connection member is connected to the first long side of the first frame bar, and the third engaging portion of the connection member is detachably connected to the first engaging portion of the first frame bar, and the second end portion of the connection member is connected to the second long side of the second frame bar, and the fourth engaging portion of the connection member is detachably connected to the second engaging portion of the second frame bar.

In one or more embodiments, in the foregoing dummy chassis, the first engaging portion includes a first elastic arm and a first fixing block which is disposed on the first elastic arm. The third engaging portion includes a first fixing opening. Thus, the first end portion of the connection member is detachably connected to the first long side of the first frame bar through the first fixing block being engaged with the first fixing opening.

In one or more embodiments, in the foregoing dummy chassis, the second engaging portion includes a second elastic arm and a second fixing block which is disposed on the second elastic arm. The fourth engaging portion includes a second fixing opening. Thus, the second end portion of the connection member is detachably connected to the second long side of the second frame bar through the second fixing block being engaged with the second fixing opening.

In one or more embodiments, in the foregoing dummy chassis, the first frame bar is formed with a first inlet, a first sliding groove and a second sliding groove. The first inlet is formed on the first long side of the first frame bar, and located between the first sliding groove and the second sliding groove. The first sliding groove and the second sliding groove are vertically staggered from each other. The second frame bar is formed with a second inlet, a first fixing slot and a second fixing slot. The second inlet is formed on the second long side of the second frame bar, and located between the first fixing slot and the second fixing slot. The first fixing slot and the second fixing slot are vertically staggered from each other, and the first sliding groove and the first fixing slot are commonly disposed at a first height, and the second sliding groove and the second fixing slot are commonly disposed at a second height which is different from the first height.

In one or more embodiments, in the foregoing dummy chassis, the connection member is provided with two first protruding portions and two second protruding portions. Each of the first protruding portions and each of the second protruding portions are oppositely arranged to two long side surfaces of the connection member which are opposite to each other. Thus, when the first end portion of the connection member is located at the first inlet, and the second end portion thereof is located at the second inlet, the first protruding portions respectively insert into the first sliding groove and the first fixing slot which are located at the same height, and the second protruding portions respectively insert into the second sliding groove and the second fixing slot which are located at the same height.

In one or more embodiments, in the foregoing dummy chassis, one side of the second frame bar being opposite to the second long side is provided with two positioning pins which are spaced arranged.

In one or more embodiments, in the foregoing dummy chassis, the first frame bar includes two elastic buckles. The elastic buckles are respectively located at two opposite ends of the first frame bar.

In one or more embodiments, in the foregoing dummy chassis, the first appearance is in an "H" shape.

In one or more embodiments, in the foregoing dummy chassis, the connection member is formed with a sunken portion. The sunken portion is formed with a bottom portion and an inner wall being adjacent to the bottom portion. Thus, when the first frame bar, the second frame bar and the connection member are combined into a second appearance, the first frame bar and the second frame bar are detachably located at the bottom portion of the sunken portion, respectively, and the second frame bar is located between the first frame bar and the inner wall of the sunken portion.

In one or more embodiments, in the foregoing dummy chassis, the connection member includes a plurality of position-limiting ribs. The position-limiting ribs are separately arranged on the inner wall of the sunken portion. The second frame bar is formed with a plurality of position-limiting slots. The position-limiting slots are separately arranged on one surface of the second frame bar. The second frame bar is sandwiched between the position-limiting ribs and the bottom portion of the sunken portion through the position-limiting ribs respectively extending into the position-limiting slots.

In one or more embodiments, in the foregoing dummy chassis, the connection member further includes two position-limiting lugs. The position-limiting lugs are separately arranged on the bottom portion of the sunken portion. Each of the position-limiting lugs is formed with a position-limiting opening. The first frame bar includes two elastic buckles, which are respectively located at two opposite ends of the first frame bar. The first frame bar is fixed between the position-limiting lugs through the elastic buckles respectively extending into the position-limiting openings.

Therefore, through the construction of the embodiments above, when the dummy chassis is assembled and disassembled, the above-mentioned embodiments of the present disclosure provide the following advantages: 1. the tool-free assembly requirements of the dummy chassis is realized; 2. mutual foolproof mechanism for the assembly of the dummy chassis is provided; and 3. when the dummy chassis is idle, the dummy chassis can be quickly minified so as to achieve the advantages of size reduction and space occupation.

In one embodiment of the disclosure, a server rack is provided, and the server rack includes a rack body, two sliding rails, a power socket and a dummy chassis. The rack body includes a front end and a rear end which are opposite to each other. The sliding rails are fixedly connected to two opposite inner sides of the rack body, respectively. The power socket is disposed on the rear end of the rack body. The dummy chassis is slidably disposed on the sliding rails, and includes a first frame bar, a second frame bar and a connection member. The first frame bar is disposed on the front end of the rack body, and provided with a first long side. The second frame bar covers the power socket, and is provided with a second long side. The connection member has a first end portion and a second end portion which are located oppositely. The first end portion is detachably connected to the first long side of the first frame bar, and the second end portion is detachably connected to the second long side of the second frame bar. The width of the connection member is less than the length of the first frame bar and a length of the second frame bar.

In one or more embodiments, in the foregoing server rack, the first frame bar includes a first elastic arm and a first fixing block which is disposed on the first elastic arm, and the first end portion of the connection member includes a first fixing opening. The first end portion of the connection member is detachably connected to the first long side of the first frame bar through the first fixing block being engaged with the first fixing opening.

In one or more embodiments, in the foregoing server rack, the second frame bar comprises a second elastic arm and a second fixing block which is disposed on the second elastic arm, and the second end portion comprises a second fixing opening. The second end portion of the connection member is detachably connected to the second long side of the second frame bar through the second fixing block being engaged with the second fixing opening.

In one or more embodiments, in the foregoing server rack, the first frame bar is formed with a first inlet, a first sliding groove and a second sliding groove. The first inlet is formed on the first long side of the first frame bar, and located between the first sliding groove and the second sliding groove. The first sliding groove and the second sliding groove are vertically staggered from each other. The second frame bar is formed with a second inlet, a first fixing slot and a second fixing slot, the second inlet is formed on the second long side of the second frame bar, and located between the first fixing slot and the second fixing slot. The first fixing slot and the second fixing slot are vertically staggered from each other, and the first sliding groove and the first fixing slot are commonly disposed at a first height, and the second sliding groove and the second fixing slot are commonly disposed at a second height which is different from the first height.

In one or more embodiments, in the foregoing server rack, the connection member is provided with two first protruding portions and two second protruding portions, each of the first protruding portions and each of the second protruding portions are oppositely arranged to two long side surfaces of the connection member which are opposite to each other. When the first end portion of the connection member is located at the first inlet, and the second end portion thereof is located at the second inlet, the first protruding portions respectively insert into the first sliding groove and the first fixing slot which are located at the same height, and the second protruding portions respectively insert into the second sliding groove and the second fixing slot which are located at the same height.

In one or more embodiments, in the foregoing server rack, the second frame bar includes two positioning pins which are spaced arranged on one side of the second frame bar being opposite to the second long side. Each of the sliding rails is provided with a positioning hole, the positioning holes are respectively disposed on the rear end of the rack body, and the positioning pins are removably disposed into the positioning holes, respectively.

In one or more embodiments, in the foregoing server rack, the first frame bar includes two elastic buckles, which are respectively located at two opposite ends of the first frame bar. Each of the sliding rails is formed with a limiting hole, and the limiting holes are disposed on the front end of the rack body, and the elastic buckles are removably disposed in the limiting holes, respectively.

In one or more embodiments, in the foregoing server rack, the dummy chassis is in an "H" shape.

Thus, through the construction of the embodiments above, when the dummy chassis is moved into the server rack, the dummy chassis occupies a configuration space of the certain layer in the rackmount chassis without receiving the server unit, which not only can be quickly and securely stored in a server rack. In addition, because the dummy chassis is located at the front end and the rear end of the rack body at the same time, not only the possibility of the maintenance personnel accidentally touching the power socket of the certain layer to be injured can be decreased, but also the preset airflow path in the server rack can be maintained, and the degree of dust or foreign objects intrusion can be reduced.

The above description is merely used for illustrating the problems to be resolved, the technical methods for resolving the problems and their efficacies, etc. The specific details of the disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
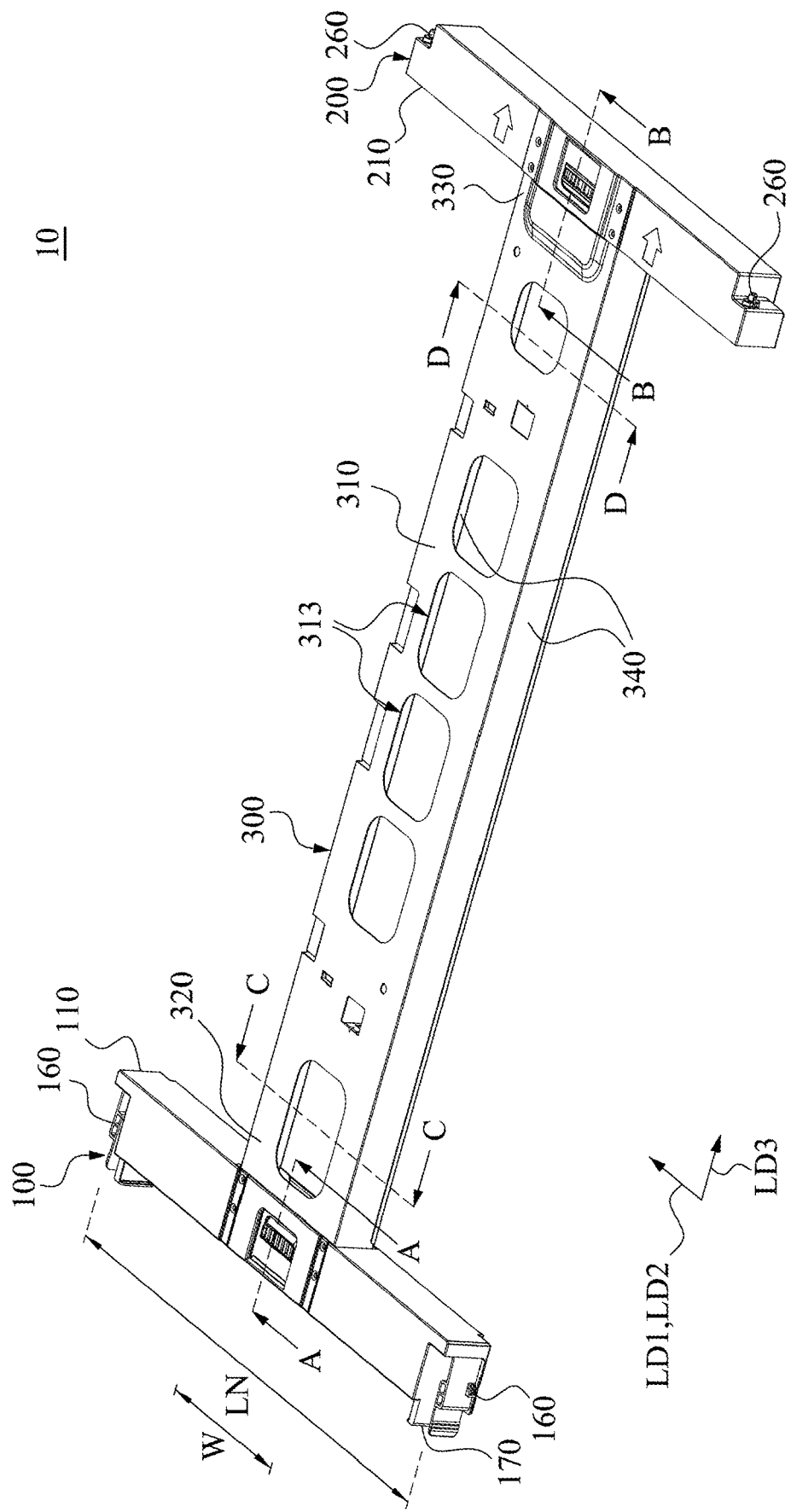
FIG. 1 is a perspective view of a dummy chassis in an unfolded appearance according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Figure 2:
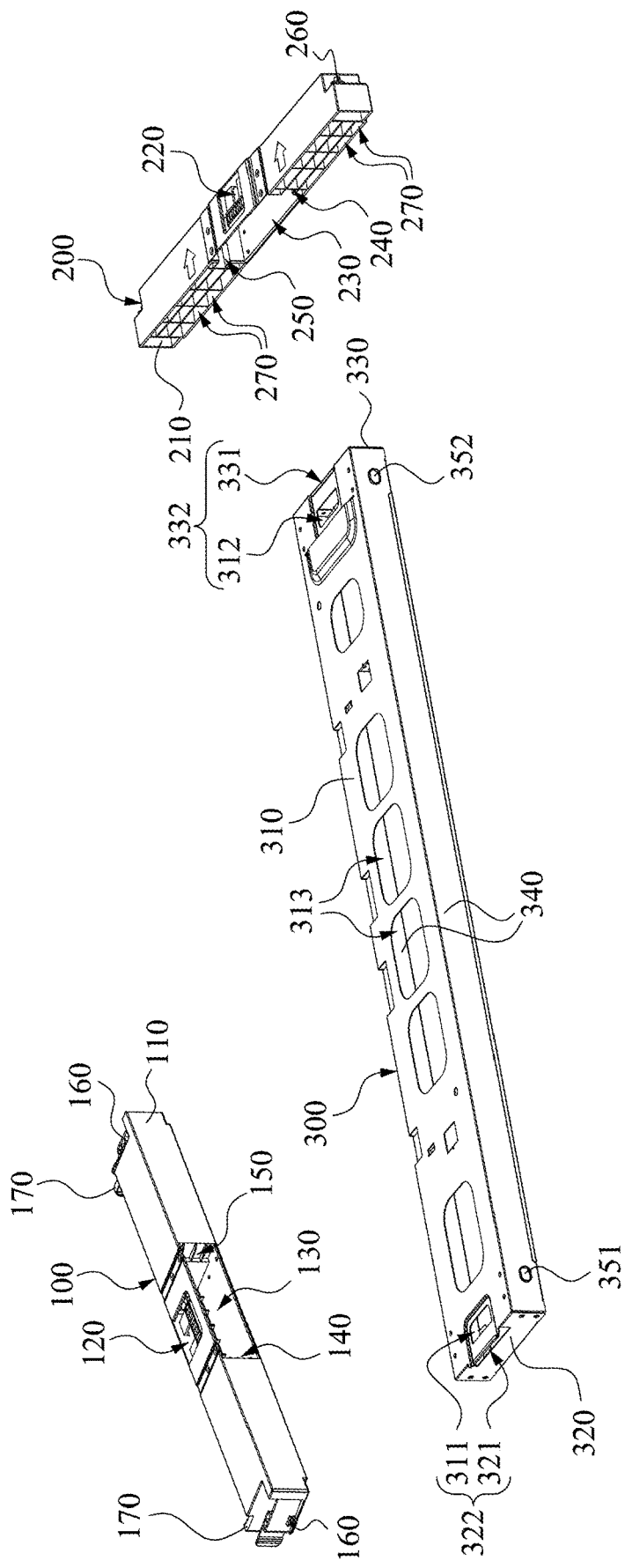
FIG. 2 is a disassembled view of the dummy chassis of FIG. 1.

Reference is now made to FIG. 1 and FIG. 2, in which FIG. 1 is a perspective view of a dummy chassis 10 in an unfolded appearance according to one embodiment of the disclosure, and FIG. 2 is a disassembled view of the dummy chassis 10 of FIG. 1. As shown in FIG. 1 and FIG. 2, in this embodiment, the dummy chassis 10 includes a first frame bar 100, a second frame bar 200 and a connection member 300. The first frame bar 100, the second frame bar 200 and the connection member 300 respectively are shaped as an elongated shape. The first frame bar 100 is provided with a first long side 110, the second frame bar 200 is provided with a second long side 210, and the connection member 300 is provided with a long top surface 310, a first end portion 320 and a second end portion 330. The first end portion 320 and the second end portion 330 are located oppositely, and the long top surface 310 is connected to the first end portion 320 and the second end portion 330. The width W of the connection member 300 is less than a length LN of the first frame bar LN and a length LN of the second frame bar 200.

Thus, when the first frame bar 100, the second frame bar 200 and the connection member 300 are combined into a unfolded appearance (e.g., using form), the first frame bar 100, the connection member 300 and the second frame bar 200 are mutually formed in an "H" shape. The long axis direction LD1 of the first frame bar 100 and the long axis direction LD2 of the second frame bar 200 are parallel to each other, and the long axis direction LD1 of the first frame bar 100 and the long axis direction LD3 of the connection member 300 are orthogonal to each other. More specifically, the first end portion 320 of the connection member 300 is detachably connected to the first long side 110 of the first frame bar 100, and the second end portion 330 of the connection member 300 is detachably connected to the second long side 210 of the second frame bar 200. Thus, when assembling and disassembling the dummy chassis 10, the above-mentioned embodiment can provide the tool-free assembly requirement for the dummy chassis 10.

Figure 3A:
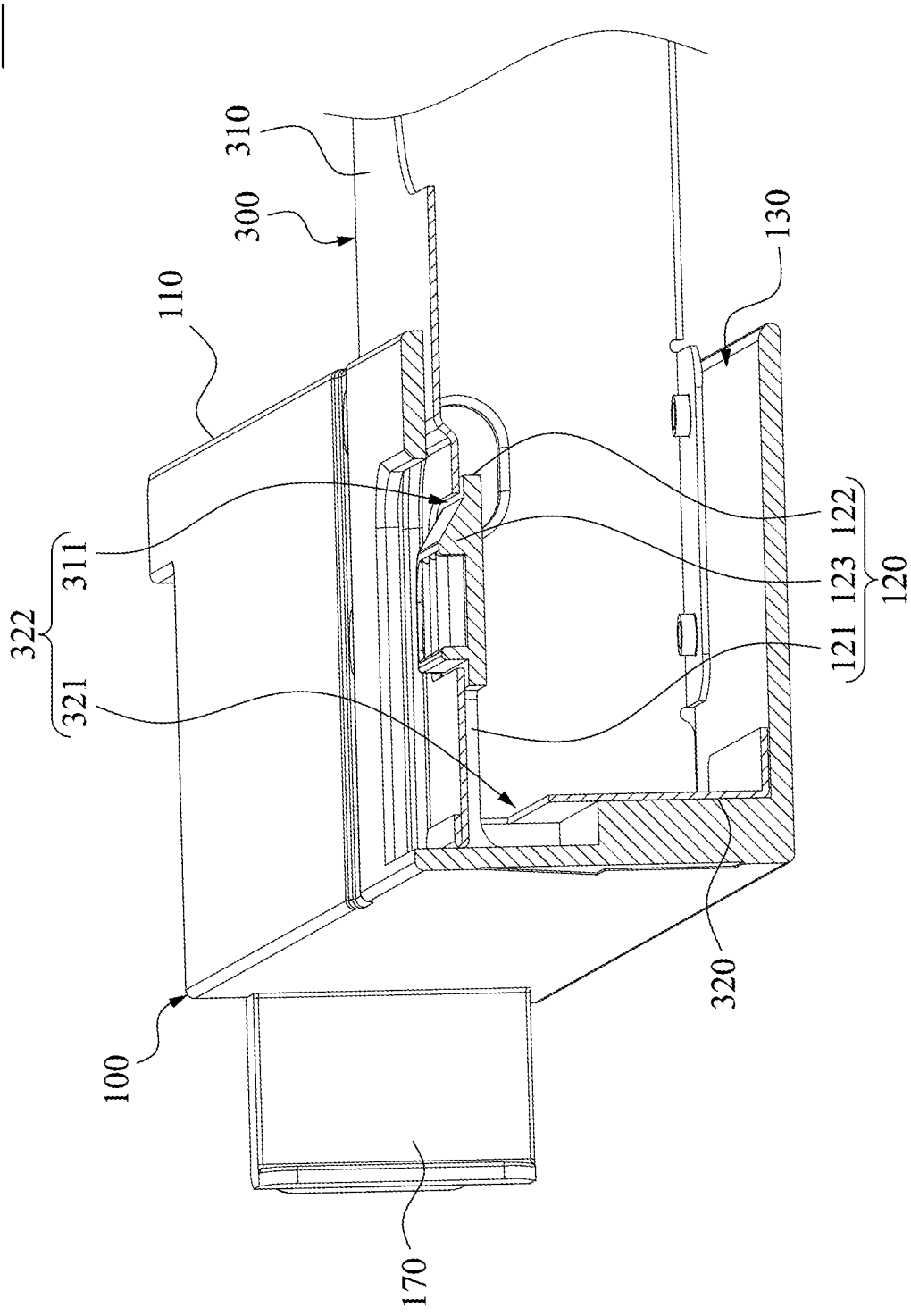
FIG. 3A is a three-dimensional sectional view of the dummy chassis taken along a line AA of FIG. 2.

FIG. 3A is a three-dimensional sectional view of the dummy chassis taken along a line AA of FIG. 2. As shown in FIG. 2 and FIG. 3A, in the embodiment, the first frame bar 100 is provided with a first engaging portion 120. The first end portion 320 of the connection member 300 is provided with a third engaging portion 322. The third engaging portion 322 is detachably connected to the first engaging portion 120. More specifically, the first frame bar 100 is formed with a first inlet 130. The first inlet 130 is formed on the first long side 110 of the first frame bar 100. The first engaging portion 120 is disposed in the first inlet 130, and the first engaging portion 120 includes a first elastic arm 121 and a first fixing block 123. One end of the first elastic arm 121 is connected to the first frame bar 100, and the other end of the first elastic arm 121 is a free end 122. The first fixing block 123 is disposed on the free end 122 of the first elastic arm 121. The third engaging portion 322 includes a first inserting opening 321 and a first fixing opening 311. The first inserting opening 321 is formed with the first end portion 320 of the connection member 300, and the first fixing opening 311 is formed on the long top surface 310 of the connection member 300.

Thus, when the first end portion 320 of the connection member 300 extends into the first inlet 130 of the first frame bar 100, the first elastic arm 121 of the first engaging portion 120 extends into the first inserting opening 321, and the first fixing block 123 is removably engaged with the first fixing opening 311 so as to achieve that the first end portion 320 of the connection member 300 is detachably connected to the first long side 110 of the first frame bar 100. on the contrary, when the first fixing block 123 is unlocked to release the first fixing opening 311, the first end portion 320 of the connection member 300 is able to be detached from the first long side 110 of the first frame bar 100.

Figure 3B:
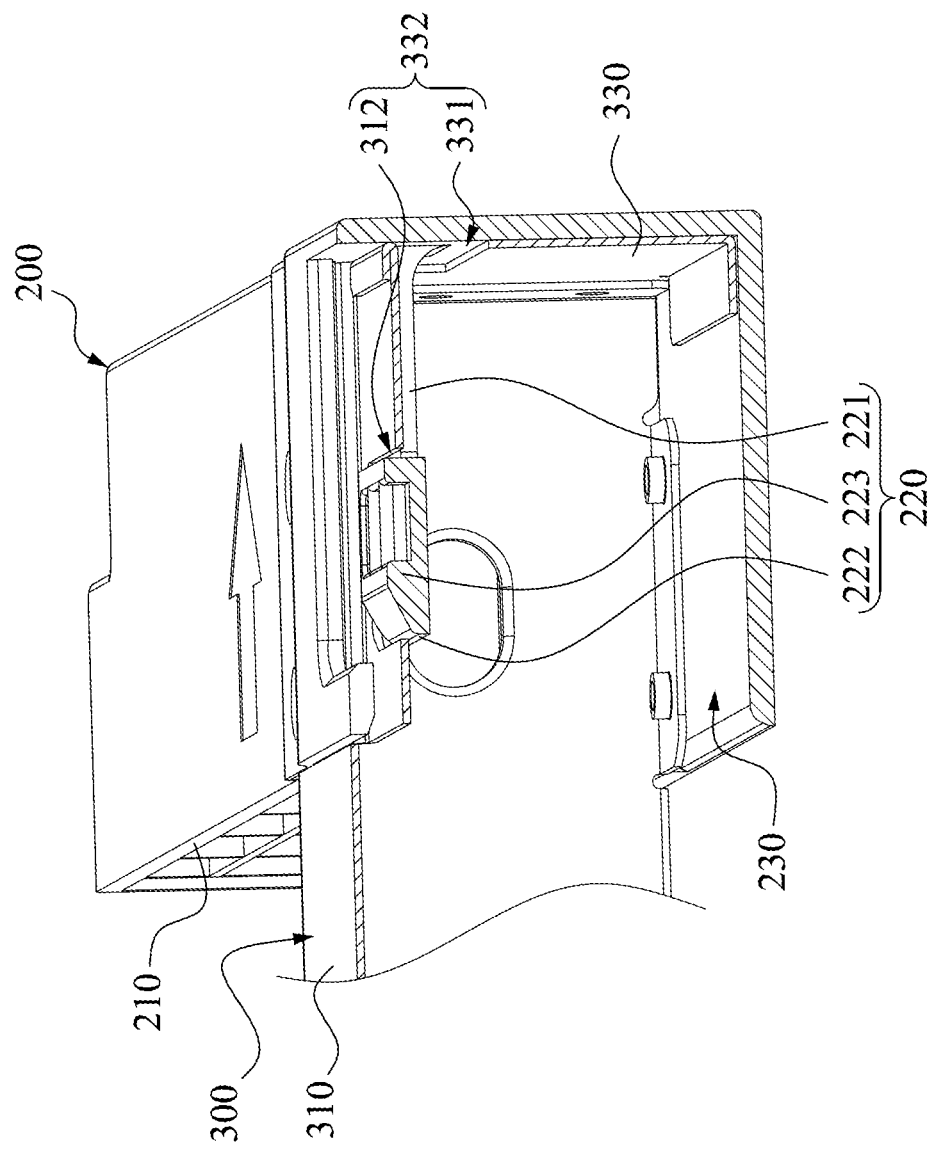
FIG. 3B is a three-dimensional sectional view of the dummy chassis taken along a line BB of FIG. 2.

FIG. 3B is a three-dimensional sectional view of the dummy chassis taken along a line BB of FIG. 2. As shown in FIG. 2 and FIG. 3B, in the embodiment, the second frame bar 200 is provided with a second engaging portion 220. The second end portion 330 of the connection member 300 is provided with a fourth engaging portion 332. The fourth engaging portion 332 is detachably connected to the second engaging portion 220. More specifically, the second frame bar 200 is formed with a second inlet 230. The second inlet 230 is formed on the second long side 210 of the second frame bar 200. The second engaging portion 220 is disposed in the second inlet 230. The second engaging portion 220 includes a second elastic arm 221 and a second fixing block 223. One end of the second elastic arm 221 is connected to the second frame bar 200, and the other end of the second elastic arm 221 is a free end 222. The second fixing block 223 is disposed on the free end 222 of the second elastic arm 221. The fourth engaging portion 332 includes a second inserting opening 331 and a second fixing opening 312. The second inserting opening 331 is formed with the second end portion 330 of the connection member 300, and the second fixing opening 312 is formed on the long top surface 310 of the connection member 300, and arranged oppositely to the first fixing opening 311.

Thus, when the second end portion 330 of the connection member 300 extends into the second inlet 230 of the second frame bar 200, the second elastic arm 221 of the second engaging portion 220 extends into the second inserting opening 331, and the second fixing block 223 is removably engaged with the second fixing opening 312 so as to achieve that the second end portion 330 of the connection member 300 is detachably connected to the second long side 210 of the second frame bar 200. On the contrary, when the second fixing block 223 is unlocked to release the second fixing opening 312, the second end portion 330 of the connection member 300 is able to be detached from the second long side 210 of the second frame bar 200.

Figure 4A:
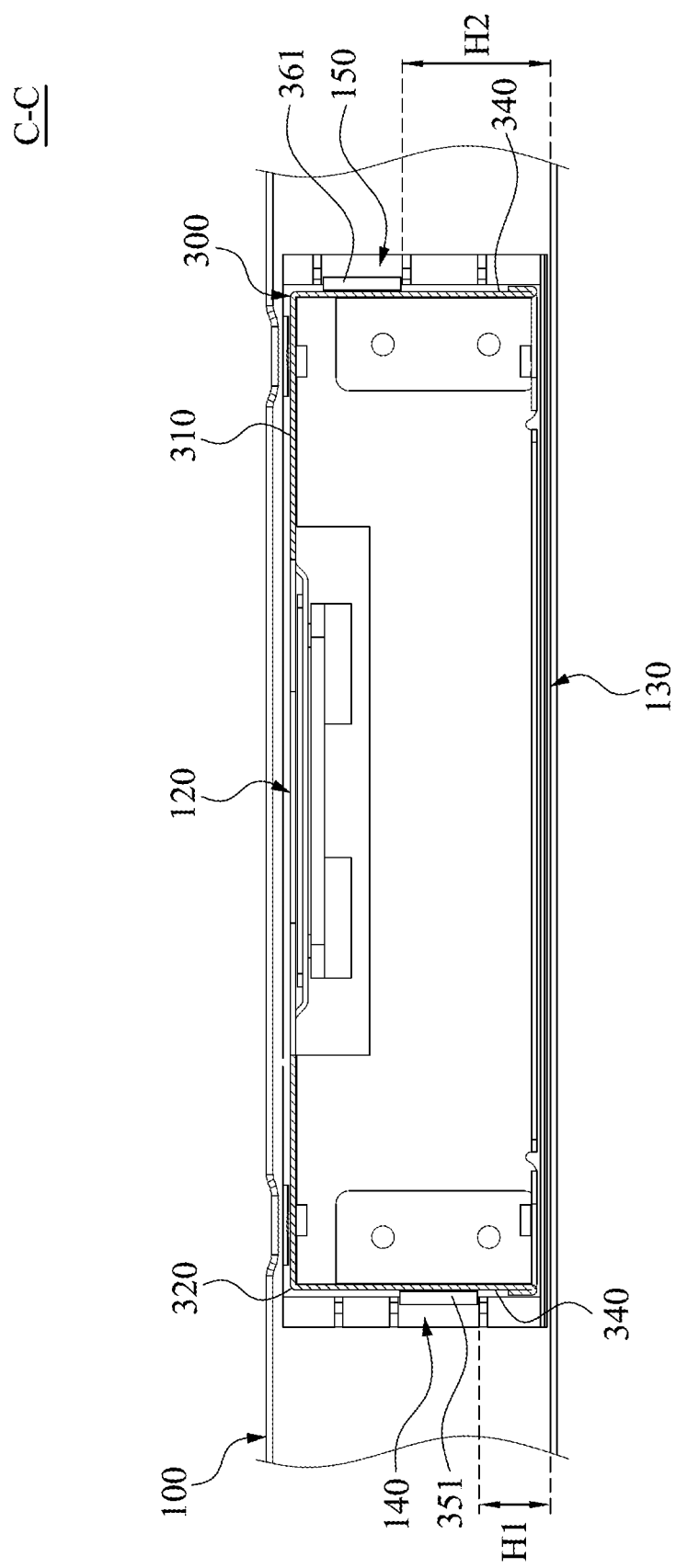
FIG. 4A is a planar sectional view of the dummy chassis taken along a line CC of FIG. 2.
Figure 4B:
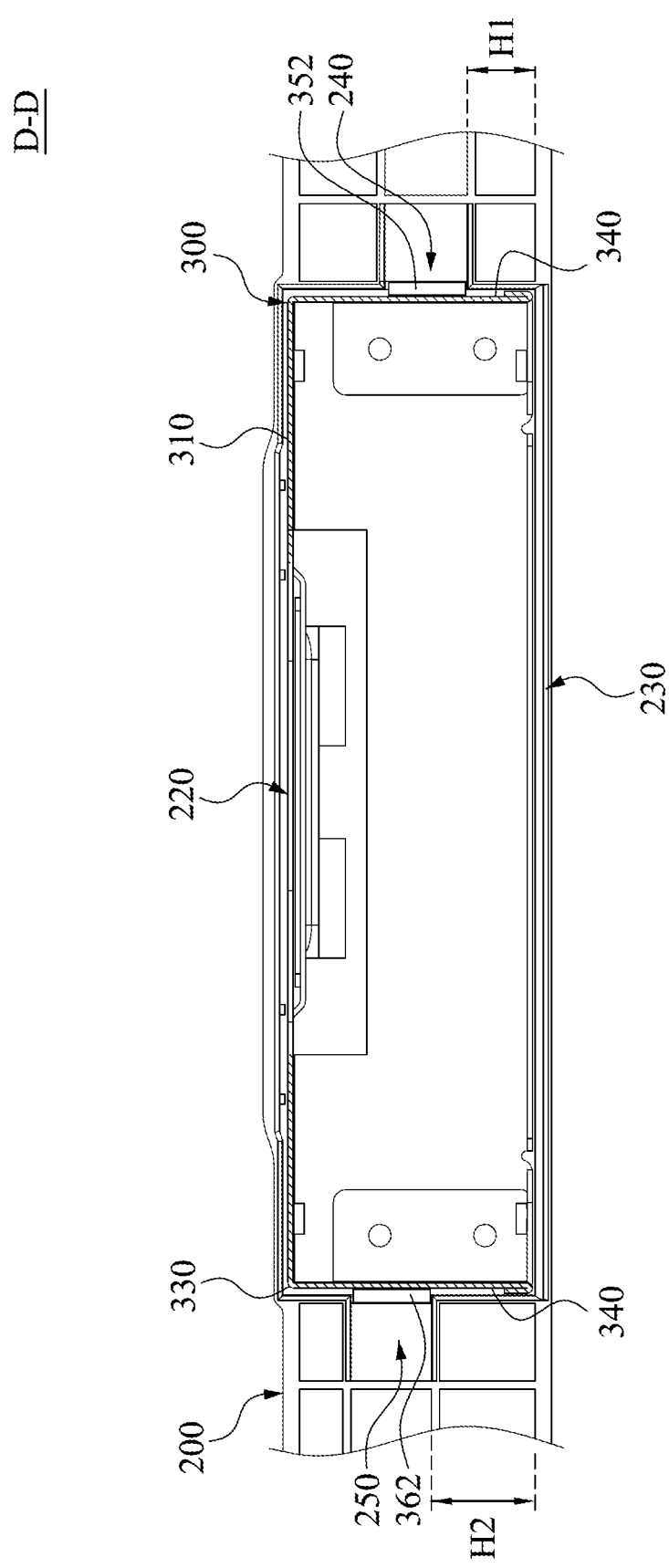
FIG. 4B is a planar sectional view of the dummy chassis taken along a line DD of FIG. 2.

FIG. 4A is a planar sectional view of the dummy chassis taken along a line CC of FIG. 2, and FIG. 4B is a planar sectional view of the dummy chassis taken along a line DD of FIG. 2. As shown in FIG. 2 and FIG. 4A, in the embodiment, the first frame bar 100 further includes a first sliding groove 140 and a second sliding groove 150. The first sliding groove 140 and the second sliding groove 150 are respectively formed on two opposite inner walls of the first frame bar 100 respectively facing with each other, that is, the first inlet 130 is formed between the first sliding groove 140 and the second sliding groove 150. The first sliding groove 140 and the second sliding groove 150 are vertically staggered from each other. Thus, the first sliding groove 140 is located at a first height H1, and the second sliding groove 150 is located at a second height H2 which is different from the first height H1.

The connection member 300 is provided with two first protruding portions 351, 352 and two second protruding portions 361, 362 (FIG. 4B). The first protruding portions 351, 352 are commonly disposed on one of the long lateral surfaces 340 of the connection member 300, and are placed oppositely. That is, one of the first protruding portions 351 is disposed on the first end portion 320 of the connection member 300, and the other of the first protruding portions 352 is disposed on the second end portion 330 of the connection member 300. The second protruding portions 361, 362 (FIG. 4B) are commonly disposed on the other of the long lateral surfaces 340 of the connection member 300, and are placed oppositely. That is, one of the second protruding portions 361 is disposed on the first end portion 320 of the connection member 300, and the other of the second protruding portions 362 (FIG. 4B) is disposed on the second end portion 330 of the connection member 300.

As shown in FIG. 2, FIG. 4A and FIG. 4B, in the embodiment, the second frame bar 200 is formed with a first fixing slot 240 and a second fixing slot 250. The first fixing slot 240 and the second fixing slot 250 are respectively formed on two opposite inner walls of the second frame bar 200 respectively facing with each other, that is, the second inlet 230 is formed between the first fixing slot 240 and the second fixing slot 250. The first fixing slot 240 and the second fixing slot 250 are vertically staggered from each other. The first fixing slot 240 and the first sliding groove 140 are commonly located at the first height H1, and the second fixing slot 250 and the second sliding groove 150 are commonly located at the second height H2.

Thus, as shown in FIG. 2 and FIG. 4A, when the first end portion 320 of the connection member 300 extends into the first inlet 130, the first protruding portion 351 disposed on the first end portion 320 is exactly fit to extend into the first sliding groove 140, and the second protruding portion 361 disposed on the first end portion 320 is exactly fit to extend into the second sliding groove 150. Similarly, as shown in FIG. 2 and FIG. 4B, when the second end portion 330 of the connection member 300 extends into the second inlet 230, the first protruding portion 352 disposed on the second end portion 330 is exactly fit to extend into the first fixing slot 240, and the second protruding portion 362 disposed on the second end portion 330 is exactly fit to extend into the second fixing slot 250.

Therefore, because the first sliding groove 140 and the second sliding groove 150 are located at different heights, and the first fixing slot 240 and the second fixing slot 250 are located at different heights, thus, a foolproof mechanism is provided for the combination of the dummy chassis 10, so that the connection member 300 can be correctly combined by the first frame bar 100 and the second frame bar 200 according to the predetermined directions, that is, the first end portion 320 is not able to be engaged with the second frame bar 200, and the second end portion 330 is not able to be engaged with the first frame bar 100.

Figure 5A:
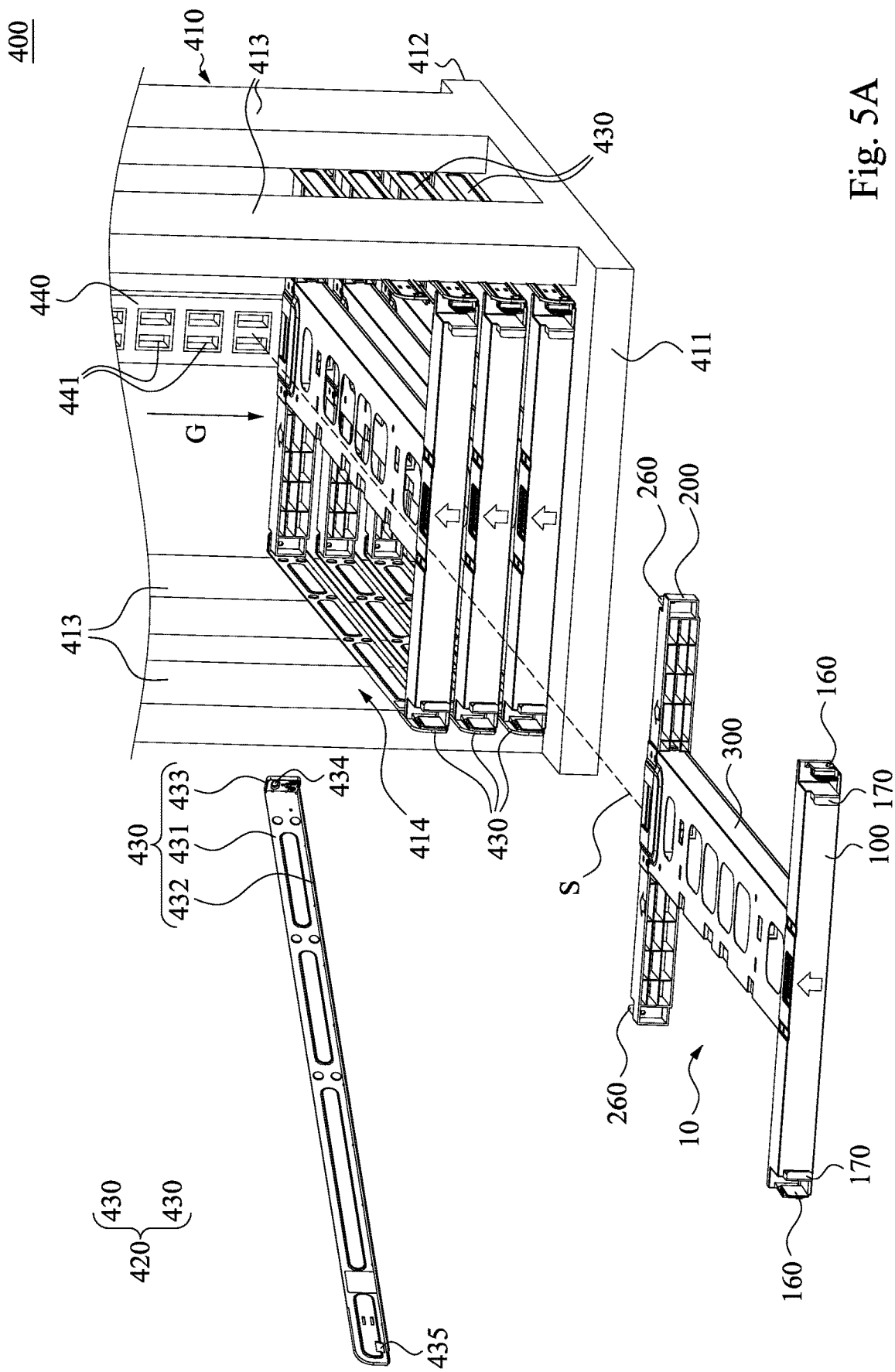
FIG. 5A is a disassembled view of a dummy chassis and a server rack according to one embodiment of the disclosure.
Figure 5B:
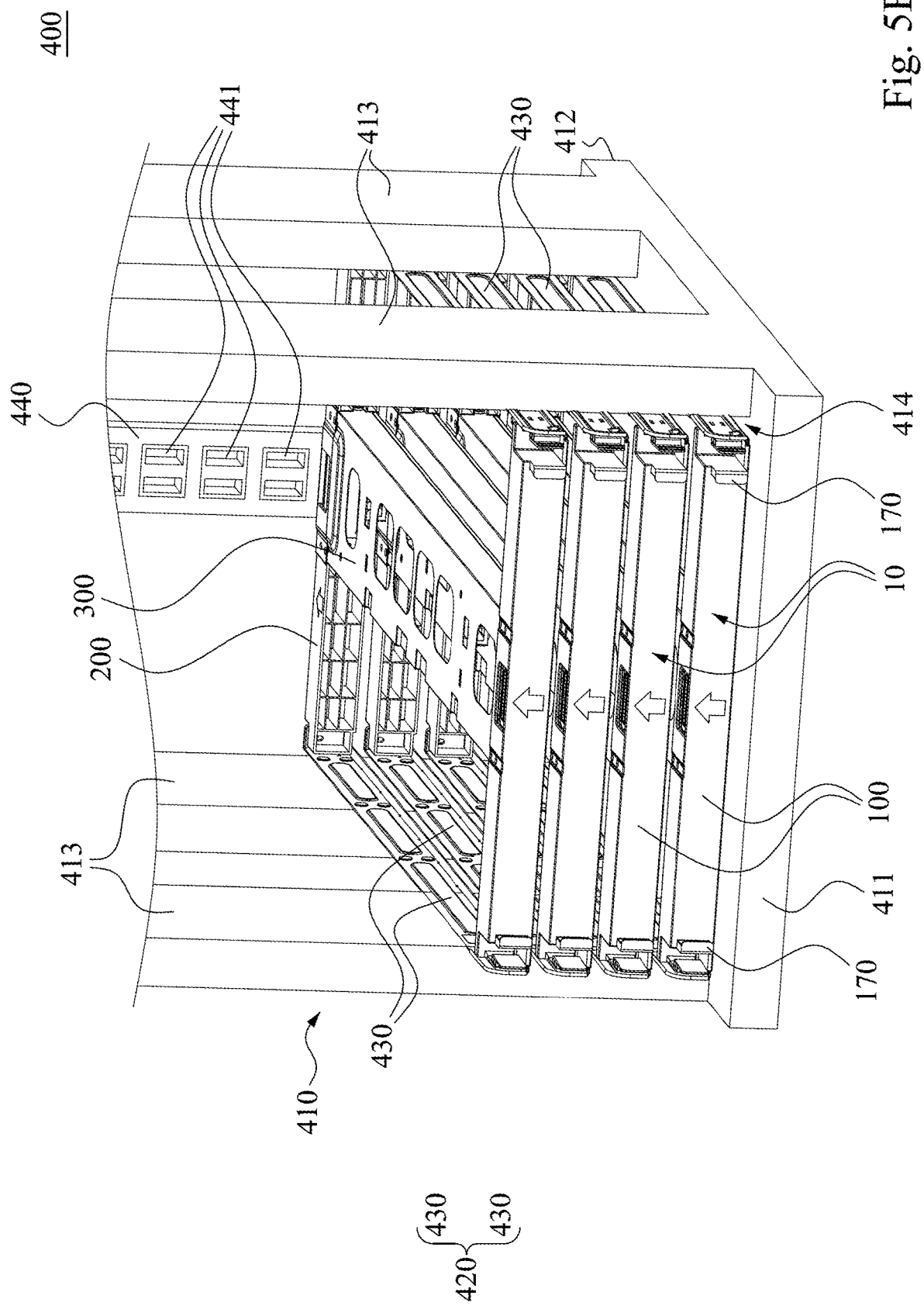
FIG. 5B is an assembled view of FIG. 5A.

FIG. 5A is a disassembled view of a dummy chassis and a server rack 400 according to one embodiment of the disclosure, and FIG. 5B is an assembled view of FIG. 5A. As shown in FIG. 5A and FIG. 5B, the server rack 400 includes a rack body 410, a plurality of sliding rail sets 420, a bracket 440 and the aforementioned dummy chassis 10 being used in the unfolded appearance. The rack body 410 includes a front end 411 and a rear end 412 which are opposite to each other. The rack body 410 is made by a plurality of columns 413 being combined together. The columns 413 are arranged to define an accommodation space 414 so that a plurality of server units (not shown) are stacked in the accommodation space 414 along a gravity direction G (i.e., vertical line). The sliding rail sets 420 are spaced arranged along the gravity direction G. Each of the sliding rail sets 420 includes two sliding rails 430 which are placed oppositely. The sliding rails 430 are fixedly connected to two opposite inner sides of the rack body 410, respectively. Each of the sliding rails 430 is located at the front end 411 and the rear end 412. The bracket 440 is uprightly fixed at the rear end 412 of the rack body 410, and the bracket 440 includes a plurality of power sockets 441 which are spaced arranged on the bracket 440 along the gravity direction G according to a single column arrangement. Each of the power sockets 441 is used to provide power for the corresponding server unit (not shown) at the same layer in the accommodation space 414. The dummy chassis 10 is slidably disposed on the sliding rails 430 at the same sliding rail set 420 so as to be pushed into the accommodation space 414 or pulled out from the accommodation space 414 along an in-out direction S. A user for the server rack 400 usually stands at the front end 411 of the rack body 410 for pulling out or pushing the server unit (not shown) into the rack body 410 in which the in-out direction S is parallel to the long axis direction LD3 of the connection member 300, and the in-out direction S is orthogonal to the gravity direction G or the long axis direction LD2 of the second frame bar 200.

Therefore, when the dummy chassis 10 is pushed into the accommodation space 414 along the sliding rails 430 of the certain sliding rail set 420, the dummy chassis 10 is located at the front end 411 and the rear end 412 of the rack body 410 at the same time. More specifically, the first frame bar 100 occupies the position of the front end 411 of the rack body 410, and the second frame bar 200 covers the corresponding one of the power sockets 441.

Thus, through the construction of the embodiments above, since the dummy chassis 10 is moved into a configuration space of the certain layer in the rackmount chassis without receiving the server unit, because the dummy chassis 10 is located at the front end 411 and the rear end 412 of the rack body 410 at the same time, not only the possibility of the maintenance personnel accidentally touching the power socket 441 of the certain layer to be injured can be decreased, but also the preset airflow path in the server rack 400 can be maintained, and the degree of dust or foreign objects intrusion can be reduced.

As shown in FIG. 5A, each of the sliding rails 430 includes a rod body 431, a rail body 432, a arc rib 433, a positioning hole 434, and a limiting hole 435. The rod body 431 and the rail body 432 respectively extend along the in-out direction S, and the long side of the rod body 431 and the long side of the rail body 432 are connected to each other. The arc rib 433 is connected to the same end of the rod body 431 and the rail body 432, and curved towards the accommodation space 414. The positioning hole 434 and the limiting hole 435 are disposed opposite to each other. The limiting hole 435 is located at the front end 411 of the rack body 410, and the positioning hole 434 is located at the rear end 412 of the rack body 410. More specifically, the limiting hole 435 is located at one end of the rod body 431 being opposite to the arc rib 433. The positioning hole 434 is located on the arc rib 433.

As shown in FIG. 1, the first frame bar 100 includes two elastic buckles 160 and two handles 170. The elastic buckles 160 are respectively located at two opposite ends of the first frame bar 100. The handles 170 are disposed on one surface of the first frame bar 100 being opposite to the connection member 300. The second frame bar 200 includes two positioning pins 260 which are spaced arranged on one side of the second frame bar 200 being opposite to the second long side 210. Thus, when the user moves the dummy chassis 10 through the handles 170 of the first frame bar 100 to push the dummy chassis 10 into the accommodation space 414 along the sliding rails 430, one end of the first frame bar 100 and one end of the second frame bar 200 which are extended towards the same direction are commonly engaged with one of the rail bodies 432 on one side of the rack body 410, and the other end of the first frame bar 100 and the other end of the second frame bar 200 which are extended towards the same direction are commonly engaged with another one of the rail bodies 432 on the other side of the rack body 410. Also, not only each positioning pin 260 can be removably inserted into one of the positioning holes 434 along the in-out direction S, but also the elastic buckles 160 are respectively removably fastened with the limiting holes 435 at the same time. Therefore, the dummy chassis 10 can be toollessly fixed in the server rack 400 stably.

Figure 6:
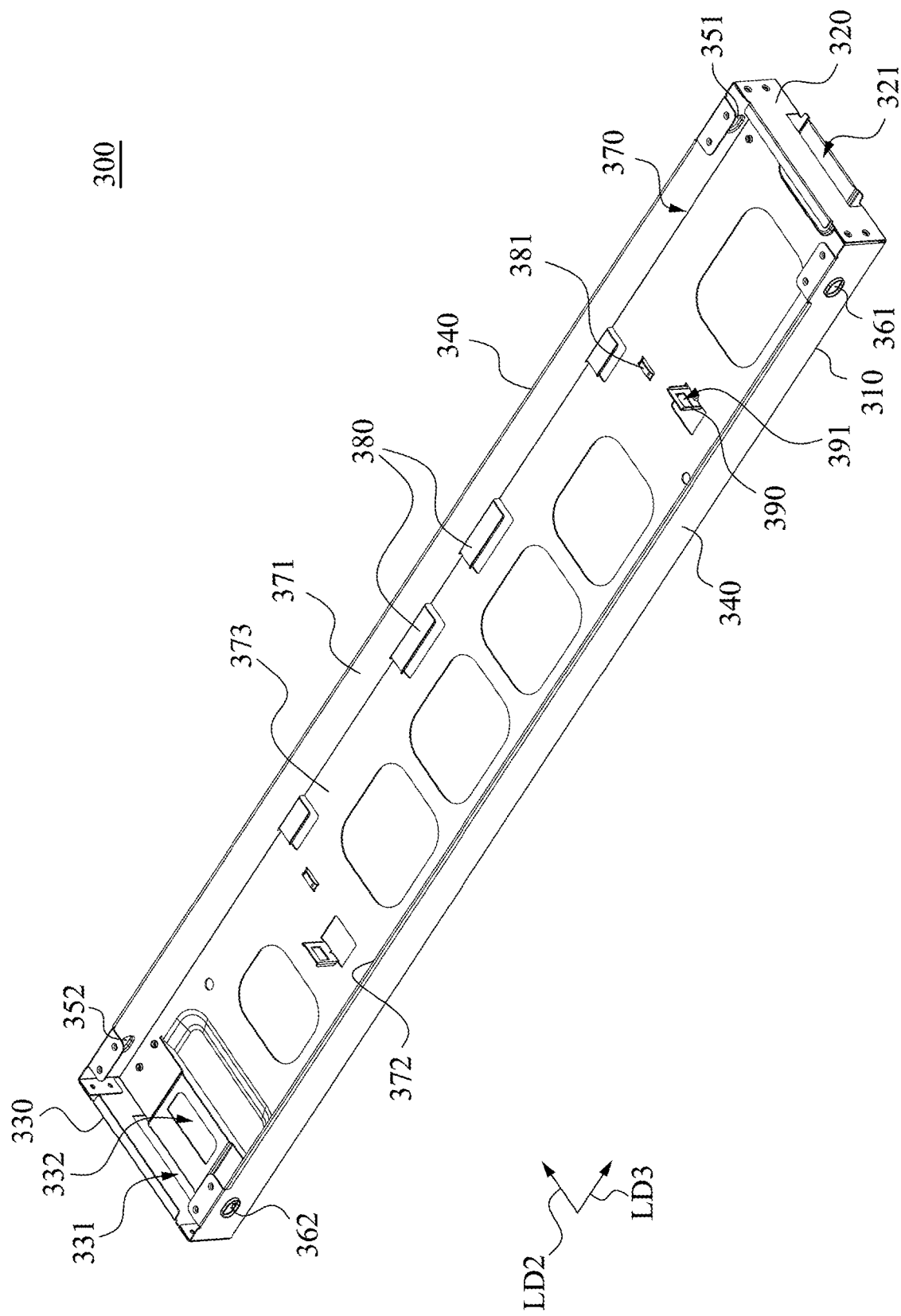
FIG. 6 is a bottom view of the connection member of FIG. 2.
Figure 7:
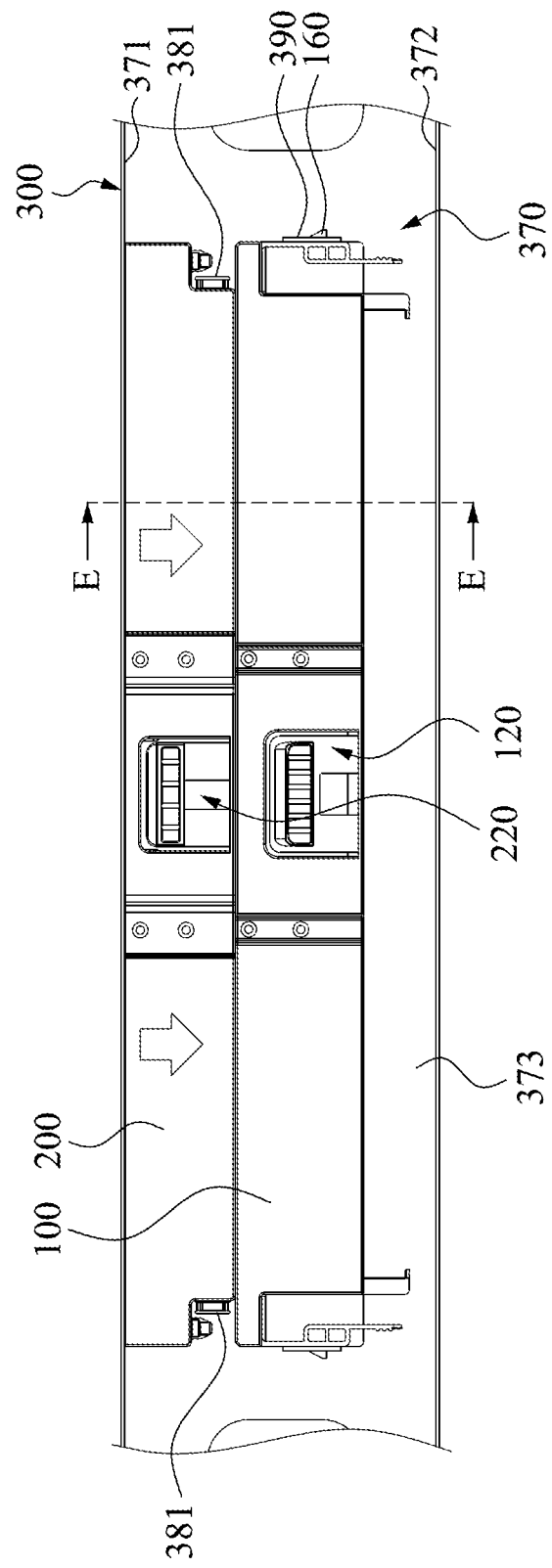
FIG. 7 is a perspective view of a dummy chassis in a shrinking appearance according to one embodiment of the disclosure.
Figure 8:
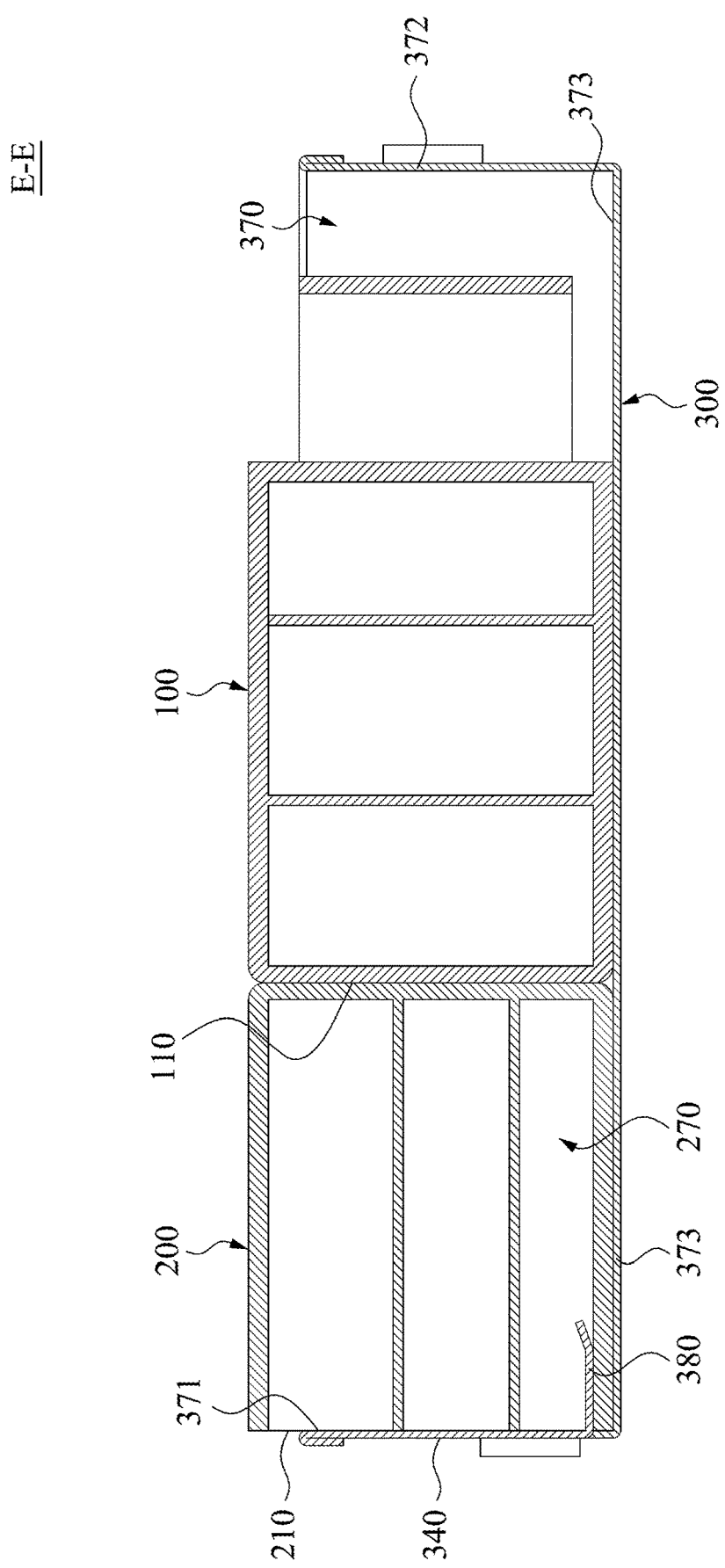
FIG. 8 is a planar sectional view of the dummy chassis taken along a line EE of FIG. 7.

Reference is now made to FIGS. 6 to 8, in which FIG. 6 is a bottom view of the connection member 300 of FIG. 2, FIG. 7 is a perspective view of a dummy chassis 11 in a shrinking appearance according to one embodiment of the disclosure, and FIG. 8 is a planar sectional view of the dummy chassis taken along a line EE of FIG. 7. As shown in FIG. 6 to FIG. 8, the connection member 300 is formed with a sunken portion 370. The sunken portion 370 is formed at one surface of the connection member 300 being opposite to the long top surface 310 (i.e., the other long top surface) so that the connection member 300 has a u-shaped cross section, exemplarily. The sunken portion 370 is formed with a bottom portion 373, a first inner wall 371 and a second inner wall 372 which are facing to each other. One of the first inner wall 371 and the second inner wall 372 is one surface of the connection member 300 facing away from one of the long lateral surfaces 340 of the connection member 300. The bottom portion 373 is located between the first inner wall 371 and the second inner wall 372, and adjoined with the first inner wall 371 and the second inner wall 372.

Thus, when the first frame bar 100, the second frame bar 200 and the connection member 300 are combined into a shrinking appearance (e.g., idle form), the first frame bar 100 and the second frame bar 200 are detachably disposed on the bottom portion 373 of the sunken portion 370, and the second frame bar 200 is sandwiched between the first frame bar 100 and the first inner wall 371 of the sunken portion 370. When the dummy chassis is idle, the first frame bar 100, the second frame bar 200 and the connection member 300 can be quickly minified so as to achieve the advantages of size reduction and space occupation.

More specifically, as shown in FIG. 2, the second frame bar 200 is formed with a plurality of position-limiting slots 270. The position-limiting slots 270 are separately arranged on the second long side 210 of the second frame bar 200. As shown in FIG. 6, the connection member 300 includes a plurality of position-limiting ribs 380, two protruding portions 381 and two position-limiting lugs 390. Each of the position-limiting ribs 380 directly extends towards the second inner wall 372 (e.g., the long axis direction LD2) from the first inner wall 371 of the sunken portion 370, and the position-limiting ribs 380 are separately arranged on the first inner wall 371 of the sunken portion 370. The protruding portions 381 symmetrically stand on the bottom portion 373 of the sunken portion 370. The position-limiting lugs 390 symmetrically stand on the bottom portion 373 of the sunken portion 370, and the position-limiting lugs 390 are spaced arranged on the bottom portion 373 of the sunken portion 370. Each of the position-limiting lugs 390 has a limiting opening 391. Each protruding portion 381 is located between the position-limiting lug 390 and the first inner wall 371.

Thus, when the user places the second frame bar 200 into the sunken portion 370 of the connection member 300 first, and assembles the second frame bar 200 to the first inner wall 371 of the connection member 300 next, the position-limiting ribs 380 respectively extend into the position-limiting slots 270, so that the bottom wall of the position-limiting slot 270 is sandwiched between the position-limiting ribs 380 and the bottom portion 373 of the sunken portion 370, and the second frame bar 200 is directly located between the protruding portions 381. Next, when the user places the first frame bar 100 into the sunken portion 370 of the connection member 300, and assembles the first frame bar 100 to one side of the first frame bar 100 facing away from the first inner wall 371, the elastic buckles 160 located at two opposite sides of the first frame bar 100 respectively extend into the limiting openings 391, so that the first frame bar 100 is fixed between the position-limiting lugs 390 of the connection member 300 so as to press the second frame bar 200 between the first frame bar 100 and the inner wall of the sunken portion 370.

It should be understood that, in this embodiment, the connection member 300 is made of metal, therefore, the above-mentioned position-limiting ribs 380, the protruding portions 381 and the position-limiting lugs 390 can be made integrally by a bending or stamping process. In addition, in order to maintain lightweight characteristics, the penetrating opening 313 are cut out separately on the connection member 300 to reduce the supporting load of the server rack 400.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A dummy chassis, comprising:
a first frame bar having a first long side and a first engaging portion;
a second frame bar having a second long side and a second engaging portion; and
a connection member having a first end portion and a second end portion which are located oppositely, the first end portion having a third engaging portion, the second end portion having a fourth engaging portion, the connection member that is formed with a sunken portion, the sunken portion that is formed with a bottom portion and an inner wall being adjacent to the bottom portion, and a width of the connection member is less than a length of the first frame bar and a length of the second frame bar,
wherein, when the first frame bar, the second frame bar and the connection member are combined into a first appearance, the first end portion of the connection member is connected to the first long side of the first frame bar, and the third engaging portion of the connection member is detachably connected to the first engaging portion of the first frame bar, and the second end portion of the connection member is connected to the second long side of the second frame bar, and the fourth engaging portion of the connection member is detachably connected to the second engaging portion of the second frame bar, when the first frame bar, the second frame bar and the connection member are combined into a second appearance, the first frame bar and the second frame bar are detachably located at the bottom portion of the sunken portion, respectively, and the second frame bar is located between the first frame bar and the inner wall of the sunken portion.

2. The dummy chassis of claim 1, wherein the first engaging portion comprises a first elastic arm and a first fixing block which is disposed on the first elastic arm, and the third engaging portion comprises a first fixing opening,
wherein the first end portion of the connection member is detachably connected to the first long side of the first frame bar through the first fixing block being engaged with the first fixing opening.

3. The dummy chassis of claim 1, wherein the second engaging portion comprises a second elastic arm and a second fixing block which is disposed on the second elastic arm, and the fourth engaging portion comprises a second fixing opening,
wherein the second end portion of the connection member is detachably connected to the second long side of the second frame bar through the second fixing block being engaged with the second fixing opening.

4. The dummy chassis of claim 1, wherein the first frame bar is formed with a first inlet, a first sliding groove and a second sliding groove, the first inlet is formed on the first long side of the first frame bar, and located between the first sliding groove and the second sliding groove, wherein the first sliding groove and the second sliding groove are vertically staggered from each other; and
the second frame bar is formed with a second inlet, a first fixing slot and a second fixing slot, the second inlet is formed on the second long side of the second frame bar, and located between the first fixing slot and the second fixing slot,
wherein the first fixing slot and the second fixing slot are vertically staggered from each other, and the first sliding groove and the first fixing slot are commonly disposed at a first height, and the second sliding groove and the second fixing slot are commonly disposed at a second height which is different from the first height.

5. The dummy chassis of claim 4, wherein the connection member is provided with two first protruding portions and two second protruding portions, each of the two first protruding portions and each of the two second protruding portions are oppositely arranged to two long side surfaces of the connection member which are opposite to each other,
wherein, when the first end portion of the connection member is located at the first inlet, and the second end portion thereof is located at the second inlet, the first protruding portions respectively insert into the first sliding groove and the first fixing slot which are located at the same height, and the second protruding portions respectively insert into the second sliding groove and the second fixing slot which are located at the same height.

6. The dummy chassis of claim 1, wherein one side of the second frame bar being opposite to the second long side is provided with two positioning pins which are spaced arranged.

7. The dummy chassis of claim 1, wherein the first frame bar comprises two elastic buckles, which are respectively located at two opposite ends of the first frame bar.

8. The dummy chassis of claim 1, wherein the first appearance is in an "H" shape.

9. The dummy chassis of claim 1, wherein the connection member comprises a plurality of position-limiting ribs, the position-limiting ribs are separately arranged on the inner wall of the sunken portion, the second frame bar is formed with a plurality of position-limiting slots, the position-limiting slots are separately arranged on one surface of the second frame bar,
wherein the second frame bar is sandwiched between the position-limiting ribs and the bottom portion of the sunken portion through the position-limiting ribs respectively extending into the position-limiting slots.

10. The dummy chassis of claim 9, wherein the connection member further comprises two position-limiting lugs, the position-limiting lugs are separately arranged on the bottom portion of the sunken portion, and each of the two position-limiting lugs is formed with a position-limiting opening; and
the first frame bar comprises two elastic buckles, which are respectively located at two opposite ends of the first frame bar,
wherein the first frame bar is fixed between the two position-limiting lugs through the two elastic buckles respectively extending into the position-limiting openings.

11. A server rack, comprising:
a rack body having a front end and a rear end which are opposite to each other;
two sliding rails fixedly connected to two opposite inner sides of the rack body, respectively;
a power socket disposed on the rear end of the rack body; and
a dummy chassis that is slidably disposed on the two sliding rails, and comprising:

a first frame bar disposed on the front end of the rack body, and provided with a first long side;

a second frame bar covering the power socket, and provided with a second long side; and a connection member having a first end portion and a second end portion which are located oppositely, the first end portion being detachably connected to the first long side of the first frame bar, and the second end portion being detachably connected to the second long side of the second frame bar, wherein the connection member is further formed with a sunken portion, the sunken portion is formed with a bottom portion and an inner wall being adjacent to the bottom portion, wherein a width of the connection member is less than a length of the first frame bar and a length of the second frame bar, when the dummy chassis is idle, the first frame bar and the second frame bar are allowed to be detachably located at the bottom portion of the sunken portion, respectively, and the second frame bar is located between the first frame bar and the inner wall of the sunken portion.

12. The server rack of claim 11, wherein the first frame bar comprises a first elastic arm and a first fixing block which is disposed on the first elastic arm, and the first end portion of the connection member comprises a first fixing opening, wherein the first end portion of the connection member is detachably connected to the first long side of the first frame bar through the first fixing block being engaged with the first fixing opening.

13. The server rack of claim 11, wherein the second frame bar comprises a second elastic arm and a second fixing block which is disposed on the second elastic arm, and the second end portion of the connection member comprises a second fixing opening, wherein the second end portion of the connection member is detachably connected to the second long side of the second frame bar through the second fixing block being engaged with the second fixing opening.

14. The server rack of claim 11, wherein the first frame bar is formed with a first inlet, a first sliding groove and a second sliding groove, the first inlet is formed on the first long side of the first frame bar, and located between the first sliding groove and the second sliding groove, wherein the first sliding groove and the second sliding groove are vertically staggered from each other; and the second frame bar is formed with a second inlet, a first fixing slot and a second fixing slot, the second inlet is formed on the second long side of the second frame bar, and located between the first fixing slot and the second fixing slot, wherein the first fixing slot and the second fixing slot are vertically staggered from each other, and the first sliding groove and the first fixing slot are commonly disposed at a first height, and the second sliding groove and the second fixing slot are commonly disposed at a second height which is different from the first height.

15. The server rack of claim 14, wherein the connection member is provided with two first protruding portions and two second protruding portions, each of the two first protruding portions and each of the two second protruding portions are oppositely arranged to two long side surfaces of the connection member which are opposite to each other, wherein, when the first end portion of the connection member is located at the first inlet, and the second end portion thereof is located at the second inlet, the first protruding portions respectively insert into the first sliding groove and the first fixing slot which are located at the same height, and the second protruding portions respectively insert into the second sliding groove and the second fixing slot which are located at the same height.

16. The server rack of claim 11, wherein the second frame bar comprises two positioning pins which are spaced arranged on one side of the second frame bar being opposite to the second long side; and each of the two sliding rails is provided with a positioning hole, the positioning holes are respectively disposed on the rear end of the rack body, and the two positioning pins are removably disposed into the positioning holes, respectively.

17. The server rack of claim 11, wherein the first frame bar comprises two elastic buckles, which are respectively located at two opposite ends of the first frame bar; and each of the two sliding rails is formed with a limiting hole, and the limiting holes are disposed on the front end of the rack body, and the elastic buckles are removably disposed in the limiting holes, respectively.

18. The server rack of claim 11, wherein the dummy chassis is in an "H" shape.

* * * * *